Aug. 12, 1969 JAMES E. WEBB 3,461,393

ADMINISTRATOR OF THE NATIONAL AERONAUTICS AND SPACE ADMINISTRATION

CASCADED COMPLEMENTARY PAIR BROADBAND TRANSISTOR AMPLIFIERS

Filed May 9, 1967 2 Sheets-Sheet 1

INVENTORS
GEORGE D. THOMPSON, JR
GEORGE F. LUTES, JR.
BY
[signature]
[signature]
ATTORNEYS

INVENTORS
GEORGE D. THOMPSON, JR.
GEORGE F. LUTES, JR.
BY
ATTORNEYS

United States Patent Office 3,461,393

Patented Aug. 12, 1969

3,461,393
CASCADED COMPLEMENTARY PAIR BROAD-BAND TRANSISTOR AMPLIFIERS

James E. Webb, Administrator of the National Aeronautics and Space Administration, with respect to an invention of George D. Thompson, Jr., La Crescenta, and George F. Lutes, Jr., South Gate, Calif.

Filed May 9, 1967, Ser. No. 638,192
Int. Cl. H03f 3/18, 3/68, 3/42
U.S. Cl. 330—13 4 Claims

ABSTRACT OF THE DISCLOSURE

A broadband distribution amplifier with a plurality of output stages. Each stage is formed of a complementary transistor pair, interconnected by a parallel capacitor and resistor network so that even at high frequencies, for example 50 mc., one of the transistors provides a very low impedance discharge path for the capacitor, to prevent bottoming. AGC is provided by inserting a thermistor into the input stage of the amplifier which receives the high frequency or RF input signals. The thermistor, due to its pure resistive characteristics, does not produce undesired phase shifts with changing frequencies. Furthermore, due to its small size, stray capacitance produced thereby is held to a minimum.

ORIGIN OF INVENTION

The invention described herein was made in the performance of work under a NASA contract and is subject to the provisions of Section 305 of the National Aeronautics and Space Act of 1958, Public Law 85–568 (72 Stat. 435; 42 USC 2457).

BACKGROUND OF THE INVENTION

Field of the invention

This invention generally relates to a broadband amplifier and, more particularly, to a broadband distribution amplifier with complementary pair transistor output stages.

Description of the prior art

The need for a distribution amplifier with a broadband in the tens of megacycles (mc.), is present in both commercial and military applications. For example, such an amplifier is useful in military communication as well as telemetry systems. Similarly, it is applicable for use in frequency modulated (FM) and television circuitry and/or in pulse and timing circuits in computer applications.

Herebefore, most distribution amplifiers with a broadband, such as 50 mc., are generally of the distributed amplifier type. Such an amplifier has several disadvantages, chief of which is its complexity due to its transmission-line type construction. Also, due to such construction and the impedance matching requirement, about half of the load output is wasted. Other types of broadband amplifiers employ transistors connected with common emitters in their output stages. Such configurations have been found to be quite inefficient.

Some prior art distribution amplifiers which do not require a bandwidth in the tens of megacycles employ complementary transistor pairs in their output stages. For example, such amplifiers are used in high fidelity audio circuits. However, their bandwidth is generally limited to the audio band of about 20 kc. Also, almost invariably, they are operated as class B or C amplifiers, rather than as class A. Thus, a need exists for an efficient distribution amplifier with a broadband, in the mc. range, which is not limited by the disadvantages of the prior art. For the purposes of this application, broadband is generally assumed to be in the tens of mc. and not less than about 1 mc.

OBJECTS AND SUMMARY OF THE INVENTION

Accordingly, it s an object of this invention to provide a new improved broadband amplifier.

Another object of this invention is the provision of a highly efficient distribution amplifier which is operable over a bandwidth of tens of megacycles, without the disadvantages of the prior art.

A further object of this invention is to provide a broadband distribution amplifier which is efficiently operable over a frequency band of about 50 mc., with relatively simple automatic gain control (AGC) means.

Still a further object is to provide an amplifier with AGC, conveniently and efficiently operable over a wide frequency band and whose output is distributable with relatively simple means.

These and other objects of the invention are achieved by providing a broadband distribution amplifier in which complementary transistor pairs are used as the output stages. Each pair is connected in a novel manner to enable it to faithfully reproduce the input signal, despite the high frequency which in one embodiment was up to 50 mc. AGC of about 20 db. is provided by a relatively simple arrangement due to the novel incorporation of a thermistor in the input stage. The thermistor, due to its pure resistive characteristics provides the necessary range of control. Yet, due to its small size, the thermistor does not produce stray capacitance which could cause significant phase shift, especially at frequencies of up to 50 mc.

The novel features that are considered characteristic of this invention are set forth with particularity in the appended claims. The invention will best be understood from the following description when read in connection with the accompanying drawings.

DESCRIPTION OF THE PREFERRED EMBODIMENTS

Figure 1:
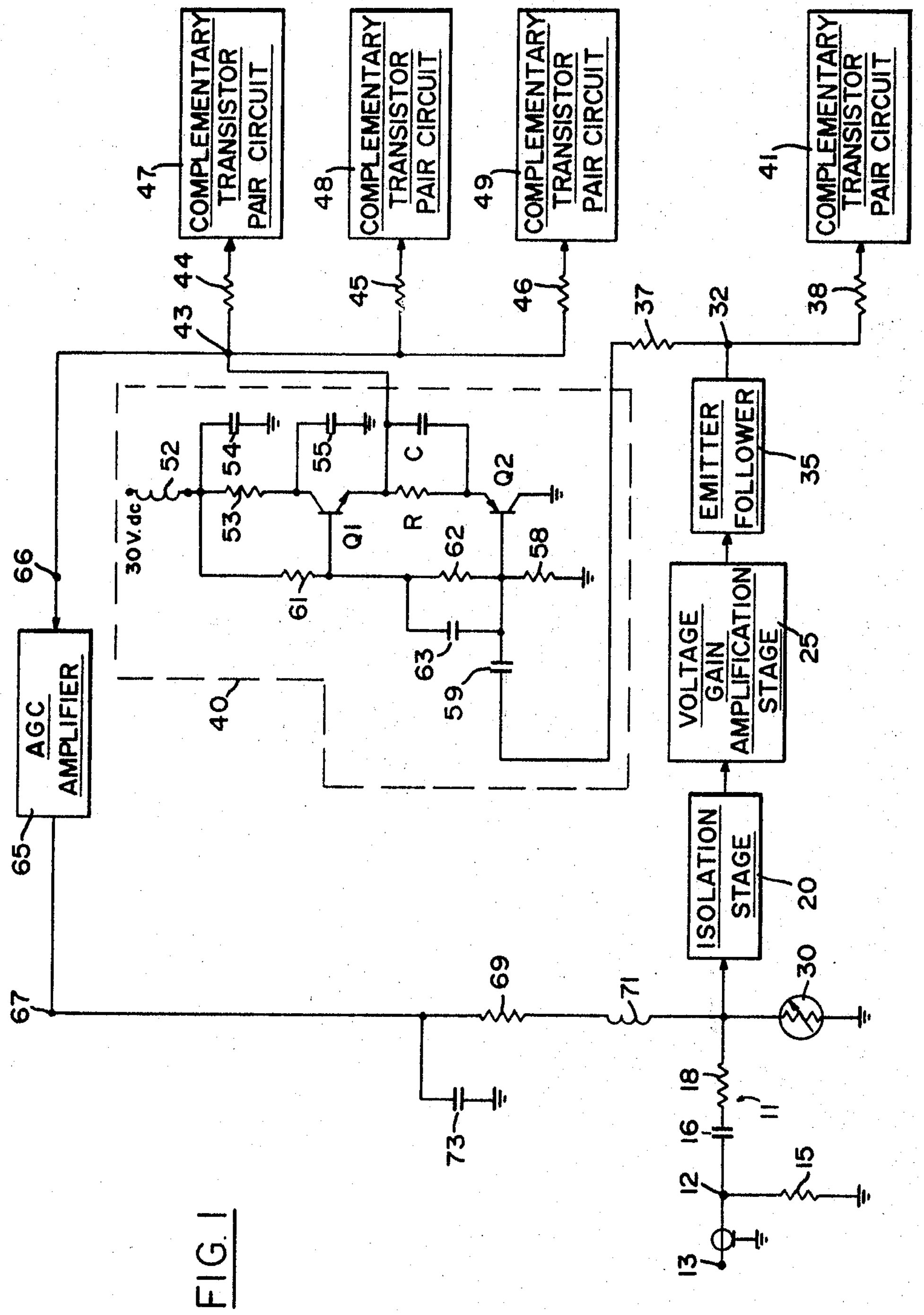
FIGURE 1 is a combination block and schematic diagram of the amplifier for the present invention.

Referring to FIGURE 1, therein the amplifier of the present invention is diagrammed, with conventional parts thereof, presented in block form, while those aspects of the amplifier which are novel are schematically detailed. The amplifier consists of an input stage 11 which is formed by a shielded input line 12, connected to an input terminal 13, with the shield connected to a reference potential, such as ground. A precise resistor 15 connects line 12 to ground. The resistive value of 15 is chosen to match the impedance of a coaxial cable assumed to be connected to terminal 13 to supply the amplifier with the high frequency input signals.

The input stage also includes a capacitor 16 serially connected with a resistor 18 between terminal 13 and an isolation stage 20, designed to isolate, impedance-wise, a voltage gain amplification stage 25 from the input terminal 13. A thermistor 30 whose position and function in the input stage is most significant, as will be described hereafter in detail, is connected between the input to stage 20 and ground.

In amplification stage 25, the input signal is amplified such as tenfold, with the output supplied to a distribution terminal 32, through an impedance converting stage consisting of an emitter follower 35. Stage 25 is operated, so that the signal level at terminal 32 is somewhat higher than is actually required. Thus, the function of the remainder of the amplifier is purely signal distribution, through a plurality of output stages, each assumed to have an output connectable to a different load (not shown).

In FIGURE 1, distribution terminal 32 is shown connected through identical resistors 37 and 38 to output stages 40 and 41, respectively. The output terminal 43 of stage 40 is in turn shown connected through identical resistors 44, 45, and 46 to output stages 47, 48 and 49, respectively. Stages 40, 41, 47, 48 and 49 are identical and therefore only stage 40 is shown in schematic detail. Since it consists of a complementary transistor pair, each output stage is labelled as a complementary transistor pair circuit.

Each output stage or complementary transistor pair circuit, such as 40, includes a pair of complementary transistors, such as Q1 and Q2, which are of the NPN and PNP types respectively. A significant parallel network formed by capacitor C and resistor R is connected between the emitters of the two transistors, with the emitter of Q1 being connected to the stage's output terminal. The collector of Q2 is grounded directly, while the collector of Q1 is connected to a positive reference potential such as 30 v. DC, through a high frequency filtering choke 52 and a resistor 53 which together with two relatively large capacitors 54 and 55, form a filtering network. The base of Q2 is connected to ground through a resistor 58 and to input resistor 37 through a blocking capacitor 59, while the base of Q1 is connected to the junction point of choke 52 and resistor 53 through resistor 61. Parallel resistor 62 and capacitor 63 are connected between the bases of the two transistors.

Briefly, the transistors Q1 and Q2 are connected to operate as a class A amplifier. This is accomplished by the proper selection of R and the other biasing resistors 53, 58, 61 and 62. The value of C is chosen so that its impedance is negligible down to about 20 kc. For example, when C is 1 microfarad, its impedance at 20 kc. is about 8 ohms. At high frequencies, in the tens of mc., unless the capacitor C is connected in parallel with R and through the emitter-collector junction of Q1 through Q2 to ground, the capacitor C would not be able to discharge fast enough in order to provide, at the output terminal, a faithful reproduction of the input signal to the stage. The inability to properly discharge would result in an undesirable condition, referred to in the art as bottoming. However, by connecting the capacitor C to ground through the emitter-collector junction of Q2, when Q2 conducts heavily, an extremely low impedance path to ground is provided, enabling C to rapidly discharge through Q2. Thus bottoming is prevented even at high frequencies such as 50 mc.

In effect, the complementary transistor pair shown in stage 40 behaves as if transistor Q1 were an emitter follower and the parallel combination of resistor R and capacitor C in series with transistor Q2 were the load. As is well known, over a wide range of loads, the gain of an emitter follower is approximately constant. Therefore, even though the load on Q1 varies, it varies within a range which permits an undistorted signal. Stated differently, regardless of the variations in the magnitude of the load, the gain of the circuit is constant, and therefore, the output is a faithful reproduction of the input. Furthermore, the output impedance is low over the entire frequency range.

The complementary transistor pair Q1 and Q2 may also be viewed as two parallel emitter followers. Since the value of C is chosen to produce a negligible impedance down to 20 kc., the two emitters from an AC point of view may be thought of as being connected to a common output terminal 43. And, since the pair are biased to operate in class A, one of them is always conducting so that a low resistance discharge path is always provided by one of the transistors for capacitor C. Thus, bottoming is prevented, even at very high frequencies since the capacitor is always provided with a very low resistance discharge path.

From the foregoing, it should thus be appreciated that in the amplifier of this invention, the input signal applied at terminal 13 and attenuated by the resistance ratio of resistor 18 and thermistor 30 is amplified by stage 25. The amplified signal at terminal 32 is applied to a plurality of complementary transistor pairs, forming output stages. Each of these stages includes an arrangement as herebefore described, whereby the bottoming of the output of each stage is prevented, even at high frequencies in the tens of mc., due to the novel discharge path provided for the output capacitor. Thus, the amplifier is operable over a broad frequency range.

To maintain the output level of each stage relatively constant, despite large variations in the level of the input signals at terminal 13, assumed to vary by 20 db, an automatic gain control (AGC) arrangement is incorporated in the amplifier. Basically, it consists of an AGC amplifier 65 whose input terminal 66 is connected to one of the output stages, such as stage 40, at terminal 43. The amplifier 65, which may be of the difference amplifier type, well known in the art, provides a DC voltage output at terminal 67. The level and polarity of the DC voltage are directly related to the deviation of the output of stage 40 from a preselected level. Terminal 67 is connected to the thermistor 30 through serially connected resistor 69 and an RF choke 71. Also, the terminal 67 is connected to ground through a relatively large-sized filtering capacitor 73. Basically, as the DC voltage at terminal 67 increases, the current through the thermistor 30 increases, resulting in the lowering of the thermistor's resistance due to its increased temperature which is produced by larger power dissipation therein. In practice, the thermistor 30 is chosen to provide a sufficient resistance change, so that the desired AGC, such as 20 db is achieved.

It should be pointed out that the choice of a thermistor is significant not only due to its negative coefficient of resistance which results in reduced resistance with increase of temperature or current, but also due to its size. Since the thermistor is physically very small, it can be incorporated in the input stage, receiving high frequency such as RF signals, without producing adverse effects such as stray capacitance. Also, since the thermistor's equivalent circuit is purely resistive, it causes negligible phase shifts with frequency changes of the input signal. Thus, its use in the input stage to provide the desired AGC is most significant. In contrast, conventional RC networks, used in prior art AGC circuits, would cause prohibitively large stray capacitance and phase shifts over a wide frequency band as is contemplated for the amplifier of the present invention.

Figure 2:
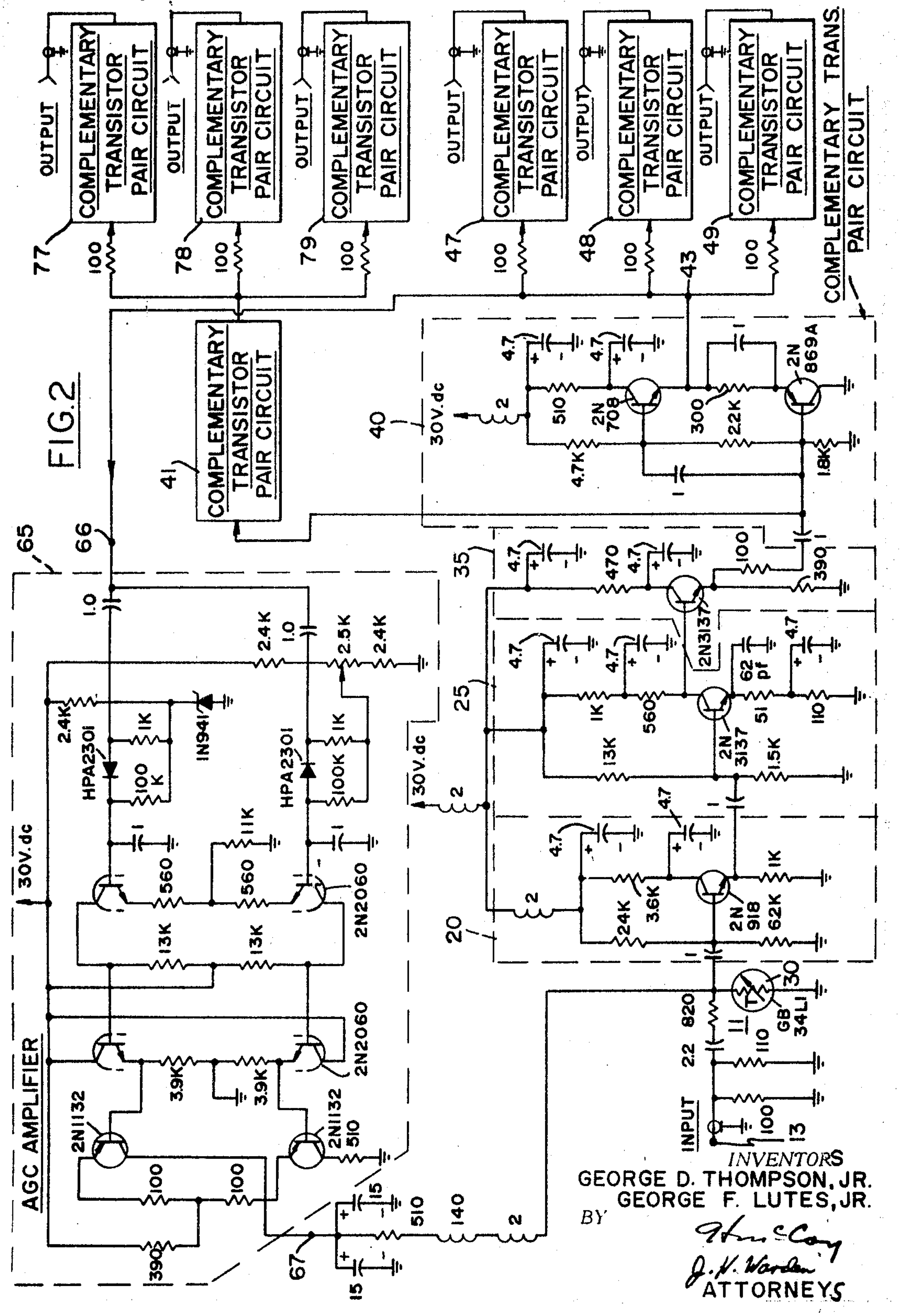
FIGURE 2 is a schematic diagram of one amplifier of this invention, actually reduced to practice.

As an exemplary embodiment of the broadband distribution amplifier of the present invention, reference is made to the schematic diagram of FIGURE 2. Therein, the values of the various components and component types are designated. Resistance is in ohms, capacitance in microfarads and inductance in millihenrys. The diagrammed amplifier has been found to operate most satisfactorily over a frequency band of better than 50 mc. The output level was constant to within 3 db over the entire frequency band.

There has accordingly been shown and described a novel broadband distribution amplifier. It should be appreciated that those familiar with the art may make modifications in the arrangements as shown without departing from the spirit of the invention. Therefore, all such modifications and/or equivalents are deemed to fall within the scope of the invention.

I claim:

1. A broadband distribution amplifier comprising:
   an input stage to which input signals are applied;
   amplification means responsive to the signals applied to said input stage for amplifying said input signals;
   first and second output stages, each having input and output terminals; and
   coupling means for coupling said amplification means to the input terminal of said first output stage and for coupling the output and input terminals of said first and second output stages, respectively, each output stage including first and second transistors of opposite conductivity types, each transistor having base, collector and emitter electrodes, means coupling the base electrodes of said first and second transistors to the input terminal of the output stage, means connecting the collector electrodes between first and second reference potentials, a resistor connected between the emitter electrode of said first and second transistors, a capacitor connected across said resistor, and means connecting the emitter of said first transistor to said output terminal, the value of said capacitor being selected whereby said second transistor in a conductive state provides a path for said capacitor to discharge at a sufficiently fast rate over the entire range of frequencies of the input signals so that the waveshape of the signal at said output terminal substantially conforms to the waveshape of the signal applied at said input terminal, the output terminal of each output stage being adapted to be connected to means for utilizing said amplified input signals.

2. The broadband distribution amplifier of claim 1 wherein said amplifier further includes a gain control amplifier to which the signals at the output terminal of said first output stage are applied for providing to said input stage a direct current potential related to the level of the signal applied thereto, and a small sized resistive element with a negative temperature coefficient of resistance included in said input stage and responsive to said direct current potential for varying the amplitude of the input signals applied to said amplification means to maintain the level of the signals at the output terminal of said first output stage within a preselected range.

3. The broadband distribution amplifier of claim 2 wherein the input signals are supplied at frequencies of *n* signals per second, *n* including the range of 1 million to 50 million and wherein said small-sized resistive element is a thermistor having substantially pure resistive characteristics to minimize phase shifts of the high frequency input signals and minimize stray capacitance produced in said input stage due to its small size.

4. The broadband distribution amplifier of claim 3 further including third and fourth output stages having their input and output terminals respectively connected to the input and output terminals of said first output stage, the output terminal of each of said third and fourth output stages being adapted to be connected to a signal load for supplying thereto the amplified input signals.

References Cited

UNITED STATES PATENTS

| | | | |
|---|---|---|---|
| 2,867,774 | 1/1959 | Bell | 330—143 X |
| 3,160,767 | 12/1964 | Tindall | 330—13 X |
| 3,262,060 | 7/1966 | Gorlin | 330—17 X |

ROY LAKE, Primary Examiner

SIEGFRIED H. GRIMM, Assistant Examiner

U.S. Cl. X.R.

330—17, 18, 29, 30, 144